(12) United States Patent
Okabe et al.

(10) Patent No.: US 11,018,214 B2
(45) Date of Patent: May 25, 2021

(54) DISPLAY DEVICE

(71) Applicant: SHARP KABUSHIKI KAISHA, Sakai (JP)

(72) Inventors: Tohru Okabe, Sakai (JP); Ryosuke Gunji, Sakai (JP); Hiroki Taniyama, Sakai (JP); Shinsuke Saida, Sakai (JP); Hiroharu Jinmura, Yonago (JP); Yoshihiro Nakada, Yonago (JP); Akira Inoue, Yonago (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/651,928

(22) PCT Filed: Sep. 28, 2017

(86) PCT No.: PCT/JP2017/035229
§ 371 (c)(1),
(2) Date: Mar. 27, 2020

(87) PCT Pub. No.: WO2019/064429
PCT Pub. Date: Apr. 4, 2019

(65) Prior Publication Data
US 2020/0312938 A1  Oct. 1, 2020

(51) Int. Cl.
H01L 27/32 (2006.01)
H01L 51/50 (2006.01)
H01L 51/00 (2006.01)

(52) U.S. Cl.
CPC ...... *H01L 27/3276* (2013.01); *H01L 27/3258* (2013.01); *H01L 51/0097* (2013.01); *H01L 51/50* (2013.01)

(58) Field of Classification Search
CPC ............ H01L 27/3276; H01L 27/3258; H01L 51/0097; H01L 51/50; H01L 51/5253; H01L 2251/5338
See application file for complete search history.

(56) References Cited

U.S. PATENT DOCUMENTS

2010/0320909 A1* 12/2010 Izumi ................. H01L 51/5253
315/51
2014/0217397 A1* 8/2014 Kwak ................. H01L 27/1218
257/43

(Continued)

FOREIGN PATENT DOCUMENTS

JP 2011-008969 A 1/2011
JP 2017-168308 A 9/2017

*Primary Examiner* — Errol V Fernandes
*Assistant Examiner* — Jeremy J Joy
(74) *Attorney, Agent, or Firm* — ScienBiziP, P.C.

(57) ABSTRACT

A display device includes a resin substrate, a TFT layer, a light-emitting element, a frame region, a terminal portion, a bending portion, a plurality of frame wiring lines, and at least a one-layer inorganic film. The light-emitting element includes a metal electrode provided on a flattening film included in the TFT layer. In the bending portion, an opening is formed in at least the one-layer inorganic film. A frame flattening film is provided to fill the opening. The plurality of frame wiring lines are provided on the frame flattening film across the opening. The frame wiring line is formed of a metal material identical to the metal material of the metal electrode. The frame flattening film is formed of a resin material identical to the resin material of the flattening film.

11 Claims, 11 Drawing Sheets

(56) References Cited

U.S. PATENT DOCUMENTS

| | | | |
|---|---|---|---|
| 2016/0141547 A1* | 5/2016 | Kim | H01L 51/5246 |
| | | | 257/40 |
| 2016/0233289 A1* | 8/2016 | Son | H01L 27/3258 |
| 2017/0062760 A1* | 3/2017 | Kim | H01L 27/3276 |
| 2017/0170206 A1* | 6/2017 | Lee | H01L 29/78633 |
| 2017/0271423 A1* | 9/2017 | Murai | H01L 27/3276 |
| 2017/0288005 A1* | 10/2017 | Kawata | H01L 27/1218 |
| 2017/0309651 A1* | 10/2017 | Kim | G02F 1/133305 |
| 2018/0047802 A1* | 2/2018 | Yoon | H01L 27/3262 |
| 2018/0061917 A1* | 3/2018 | Kim | H01L 51/5253 |
| 2018/0145125 A1* | 5/2018 | Lee | H01L 27/3262 |

\* cited by examiner

DISPLAY DEVICE

TECHNICAL FIELD

The present invention relates to a display device.

BACKGROUND ART

In recent years, self-luminous organic EL display devices using organic electroluminescence (EL) elements have attracted attention as display devices that may replace liquid crystal display devices. As this type of organic EL display device, a flexible organic EL display device is proposed in which an organic EL element or the like is formed on a resin substrate having flexibility.

A rectangular display region for displaying an image and a frame region formed on the periphery of the display region are provided in an organic EL display device, and reduction in size of the frame region is required. To meet this requirement, in the flexible organic EL display device, a method for reducing the frame region by, for example, bending the frame region on a terminal side is proposed.

For example, there is disclosed a flexible organic EL display device including a resin substrate layer, an inorganic film and a flattening film provided on a surface of the resin substrate layer, and a frame wiring line provided on a surface of the flattening film in a bending portion provided in a frame region on a terminal side (for example, see JP 2011-8969 A).

SUMMARY OF INVENTION

In the flexible organic EL display device, in general, the inorganic film is removed and a source wiring line is used as the frame wiring line in the above-mentioned bending portion; because of this, under the source wiring line, a frame flattening film formed with an expensive material such as a polyimide resin needs to be added to an opening formed by the removal of the inorganic film. Accordingly, there arises a problem that the manufacturing cost of the organic EL display device increases.

One embodiment of the present invention has been conceived in view of the above problem, and an object thereof is to provide a display device able to be manufactured at small cost in comparison with the conventional art.

In order to achieve the above object, a display device according to one aspect of the present invention includes a resin substrate; a TFT layer provided on the resin substrate and having a flattening film; a light-emitting element provided on the resin substrate with the TFT layer interposed between the light-emitting element and the resin substrate to constitute a display region; a frame region provided on a periphery of the display region; a terminal portion provided at an end portion of the frame region; a bending portion provided between the display region and the terminal portion; a frame wiring line provided in the frame region, connected to the light-emitting element, and extended to the terminal portion; and at least a one-layer inorganic film provided in the frame region to constitute the TFT layer layered on the resin substrate. The light-emitting element includes a metal electrode provided on the flattening film; in the bending portion, an opening is formed in at least the one-layer inorganic film, a frame flattening film is provided to fill the opening, and the frame wiring line is provided on the frame flattening film; and the frame wiring line is formed of a metal material identical to the metal material of the metal electrode, and the frame flattening film is formed of a resin material identical to the resin material of the flattening film.

According to one embodiment of the present invention, a process of forming a frame flattening film to cover the opening formed in the bending portion is unnecessary; thereby making it is possible to significantly reduce the cost of the organic EL display device.

DESCRIPTION OF EMBODIMENTS

Embodiments of the present invention will be described below in detail with reference to the drawings. The present invention is not limited to the embodiments described below.

First Embodiment

Figure 1:
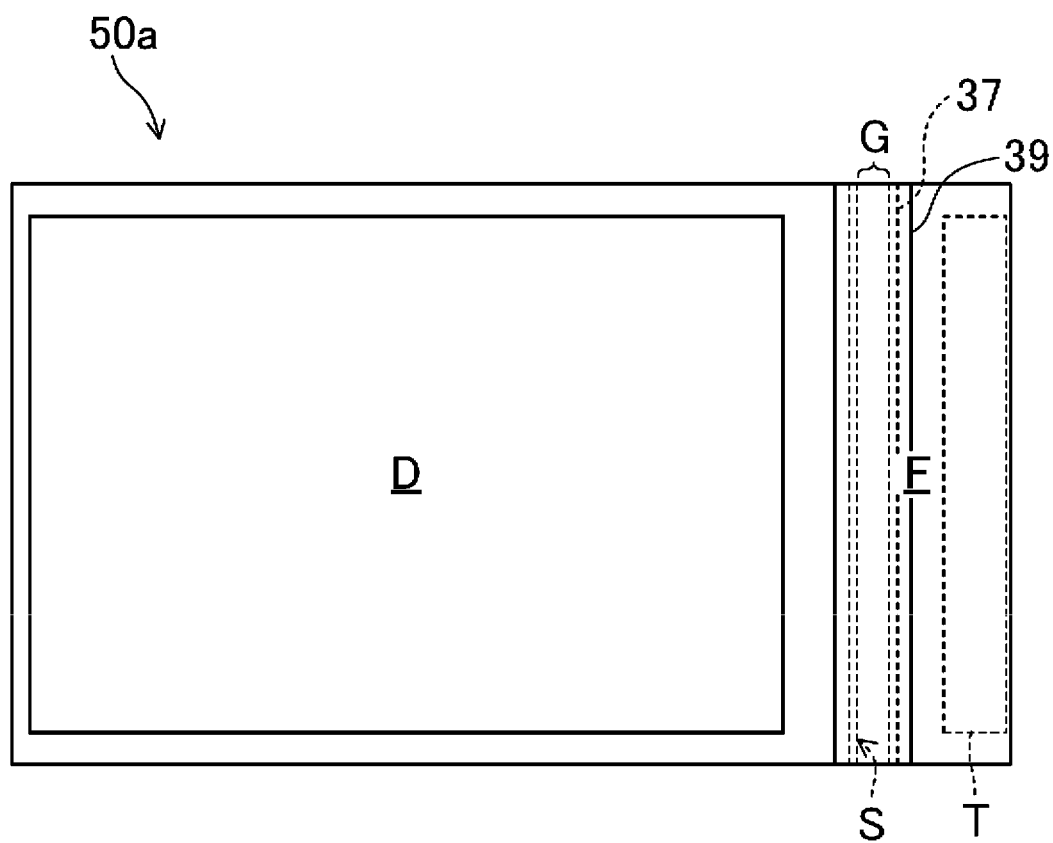
FIG. 1 is a plan view of an organic EL display device according to a first embodiment.
Figure 2:
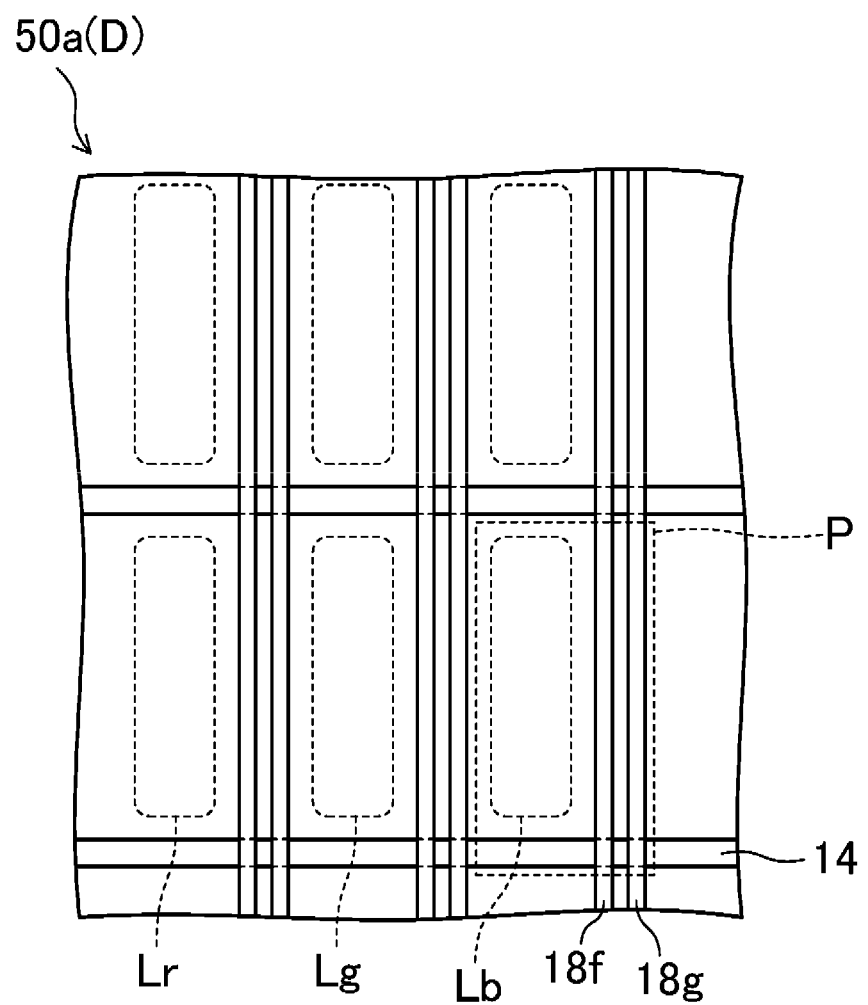
FIG. 2 is a plan view of a display region of the organic EL display device according to the first embodiment.
Figure 3:
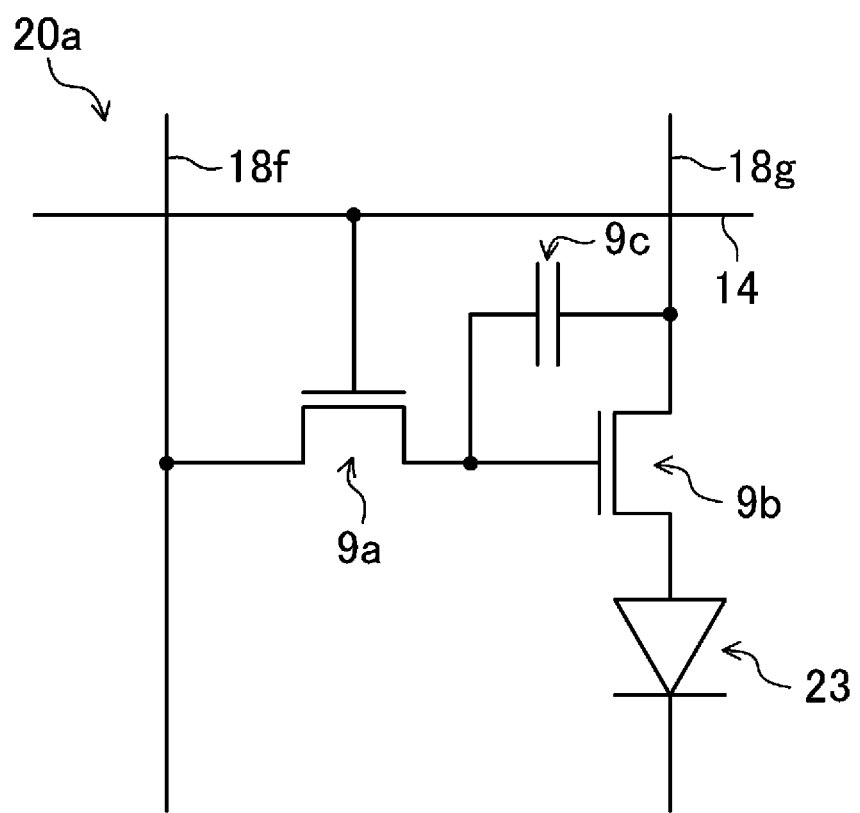
FIG. 3 is an equivalent circuit diagram illustrating a TFT layer constituting the organic EL display device according to the first embodiment.
Figure 4:
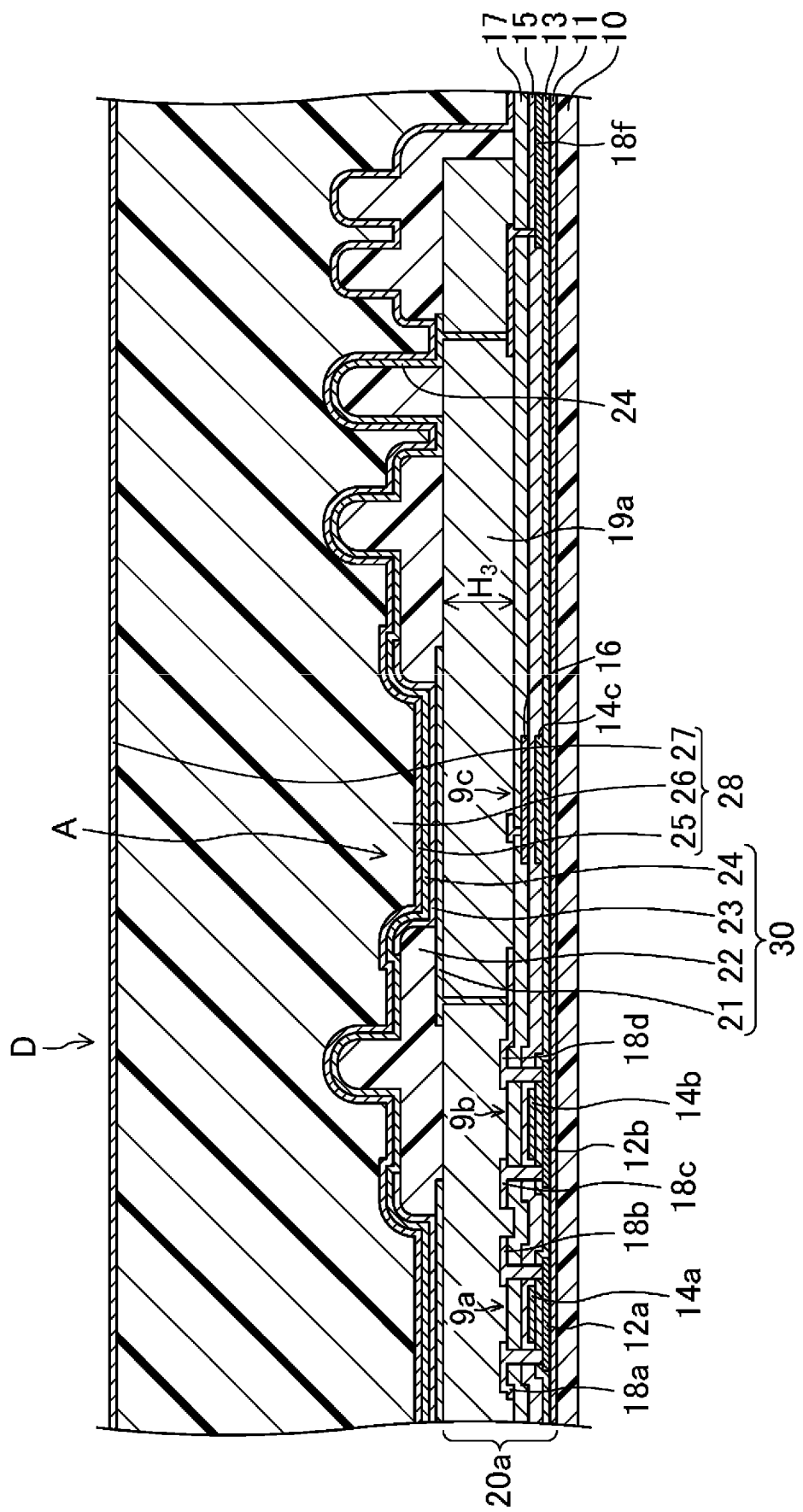
FIG. 4 is a cross-sectional view of a display region of the organic EL display device according to the first embodiment.
Figure 5:
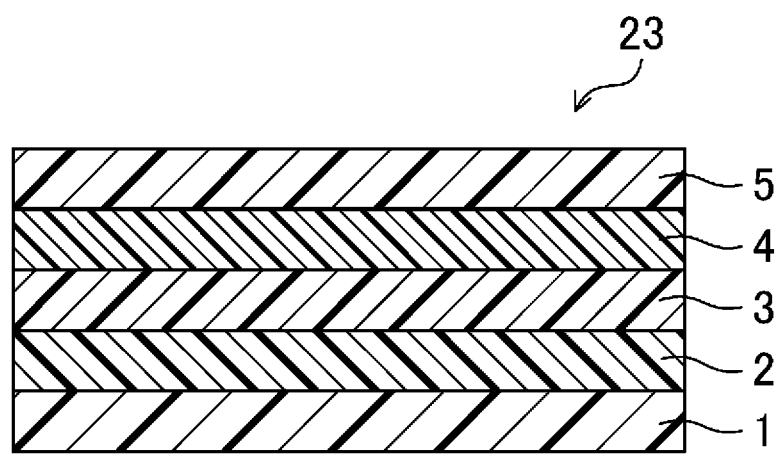
FIG. 5 is a cross-sectional view illustrating the organic EL layer constituting an organic EL display device according to the first embodiment.

FIGS. 1 to 5 illustrate a first embodiment of a display device according to the present invention. In each of the following embodiments, an organic EL display device including an organic EL element will be exemplified as a display device including a light-emitting element. Here, FIG. 1 is a plan view of an organic EL display device 50a of the present embodiment. FIG. 2 is a plan view of a display region D of the organic EL display device 50a. FIG. 3 is an equivalent circuit diagram illustrating a TFT layer 20a constituting the organic EL display device 50a. FIG. 4 is a cross-sectional view of the display region D of the organic EL display device 50a. FIG. 5 is a cross-sectional view illustrating an organic EL layer 23 constituting the organic EL display device 50a.

As illustrated in FIG. 1, the organic EL display device 50a includes the display region D configured to display an image defined to a rectangular shape and a frame region F defined on the periphery of the display region D.

As illustrated in FIG. 4, in the display region D of the organic EL display device 50a, an organic EL element 30 is provided and a plurality of pixels are arranged in a matrix shape. As illustrated in FIG. 1, a terminal portion T is provided at the right end portion of the frame region F in the drawing. Further, as illustrated in FIG. 1, between the display region D and the terminal portion T in the frame region F, a bending portion G bendable at 180 degrees (in a U shape) about a bending axis being the vertical direction in the drawing is provided along one side (the right side in the drawing) of the display region D.

A plurality of subpixels P are disposed in a matrix shape in the display region D of the organic EL display device 50a, as illustrated in FIG. 2. In the display region D of the organic EL display device 50a, a subpixel P including a red light-emitting region Lr configured to execute a red gray scale display, a subpixel P including a green light-emitting region Lg configured to execute a green gray scale display, and a subpixel P including a blue light-emitting region Lb configured to execute a blue gray scale display are provided adjacent to one another, as illustrated in FIG. 2.

One pixel is constituted of the three adjacent subpixels P including the red light-emitting region Lr, the green light-emitting region Lg, and the blue light-emitting region Lb, respectively in the display region D of the organic EL display device 50a.

As illustrated in FIG. 4, the organic EL display device 50a includes a resin substrate layer 10 and an organic EL element 30 provided on the resin substrate layer 10 with the thin film transistor (TFT) layer 20a interposed therebetween to constitute the display region D.

The resin substrate layer 10 is formed, for example, of a polyimide resin or the like and is provided as a resin substrate.

As illustrated in FIG. 4, the TFT layer 20a includes a base coat film 11 provided on the resin substrate layer 10, a plurality of first TFTs 9a, a plurality of second TFTs 9b and a plurality of capacitors 9c provided on the base coat film 11, and a flattening film 19a provided on each of the first TFTs 9a, each of the second TFTs 9b and each of the capacitors 9c.

Here, in the TFT layer 20a, as illustrated in FIGS. 2 and 3, a plurality of gate lines 14 are provided as metal layers in such a manner as to extend parallel to each other in a horizontal direction in the drawings. In the TFT layer 20a, as illustrated in FIGS. 2 and 3, a plurality of source lines 18f are provided as metal layers in such a manner as to extend parallel to each other in a vertical direction in the drawings. In the TFT layer 20a, as illustrated in FIGS. 2 and 3, a plurality of power source lines 18g are provided as metal layers in such a manner as to extend parallel to each other in the vertical direction in the drawings while being adjacent to the corresponding source lines 18f. In the TFT layer 20a, as illustrated in FIG. 3, each subpixel P includes the first TFT 9a, the second TFT 9b, and the capacitor 9c.

The base coat film 11 is formed with, for example, a single-layer film or a layered film of an inorganic insulating film such as a silicon nitride film, a silicon oxide film, or a silicon oxynitride film.

The first TFT 9a is connected to the corresponding gate line 14 and source line 18f in each subpixel P as illustrated in FIG. 3. As illustrated in FIG. 4, the first TFT 9a includes a semiconductor layer 12a provided in an island shape on the base coat film 11, a gate insulating film 13 provided in such a manner as to cover the semiconductor layer 12a, a gate electrode 14a provided on the gate insulating film 13 in such a manner as to overlap part of the semiconductor layer 12a, a first interlayer insulating film 15 and a second interlayer insulating film 17, which are sequentially provided in such a manner as to cover the gate electrode 14a, and a source electrode 18a and a drain electrode 18b, which are provided on the second interlayer insulating film 17 to be disposed in such a manner as to be spaced apart from each other.

The gate insulating film 13, the first interlayer insulating film 15 and the second interlayer insulating film 17 are made up of a single-layer film or a layered film of an inorganic insulating film of, for example, silicon nitride, silicon oxide, silicon oxynitride, or the like.

The second TFT 9b is connected to the corresponding first TFT 9a and power source line 18g in each subpixel P as illustrated in FIG. 3. As illustrated in FIG. 4, the second TFT 9b includes a semiconductor layer 12b provided in an island shape on the base coat film 11, the gate insulating film 13 provided in such a manner as to cover the semiconductor layer 12b, a gate electrode 14b provided on the gate insulating film 13 in such a manner as to overlap part of the semiconductor layer 12b, the first interlayer insulating film 15 and the second interlayer film 17 that are sequentially provided in such a manner as to cover the gate electrode 14b, and a source electrode 18c and a drain electrode 18d that are provided on the second interlayer insulating film 17 to be disposed in such a manner as to be spaced apart from each other.

In this embodiment, the first TFT 9a and the second TFT 9b are described as being of a top-gate type; however, the first TFT 9a and the second TFT 9b may be a bottom-gate type TFT.

The capacitor 9c is connected to the corresponding first TFT 9a and power source line 18g in each subpixel P as illustrated in FIG. 3. The capacitor 9c includes, as illustrated in FIG. 4, a lower conductive layer 14c formed of the same material and in the same layer as those of the gate electrode, the first interlayer insulating film 15 provided in such a manner as to cover the lower conductive layer 14c, and an upper conductive layer 16 provided on the first interlayer insulating film 15 in such a manner as to overlap the lower conductive layer 14c.

In addition, in the present embodiment, the flattening film 19a is formed of an inexpensive organic resin material such as an acrylic resin or an epoxy resin. Note that the flattening film 19a may be formed of a polyimide resin.

As illustrated in FIG. 4, the organic EL element 30 includes a plurality of first electrodes (reflective electrodes) 21, a plurality of second electrodes (transparent electrodes) 24 provided opposing the first electrodes 21, a plurality of organic EL layers 23 each provided between the first electrode 21 and the second electrode 24, and a plurality of edge covers 22, which are provided in order on the flattening film 19a.

As illustrated in FIG. 4, the plurality of first electrodes 21 each function as a reflective electrode configured to reflect light emitted from the organic EL layer (light-emitting layer), and are arranged in a matrix shape as reflective electrodes on the flattening film 19a in such a manner as to correspond to the plurality of subpixels P. As illustrated in FIG. 4, the first electrode 21 is connected to the drain electrode 18d of each second TFT 9b via a contact hole formed in the flattening film 19a. The first electrode 21 functions to inject holes (positive holes) into the organic EL layer 23. The first electrode 21 is preferably formed of a material having a large work function to improve the efficiency of hole injection into the organic EL layer 23. For materials constituting the first electrode 21 include metallic materials, as examples, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). For materials constituting the first electrode 21, there may be adopted an alloy, as an example, of magnesium (Mg)/copper (Cu), magnesium (Mg)/silver (Ag), sodium (Na)/potassium (K), astatine (At)/astatine oxide (AtO$_2$), lithium (Li)/aluminum (Al), lithium (Li)/calcium (Ca)/aluminum (Al), or lithium fluoride (LiF)/calcium (Ca)/aluminum (Al). For materials constituting the first electrode 21, there may be adopted electrically conductive oxides, as examples, such as tin oxide (SnO), zinc oxide (ZnO), indium tin oxide (ITO), and indium zinc oxide (IZO). The first electrode 21 may be formed by layering a plurality of layers formed of any of the materials described above. Note that, examples of materials having a large work function include indium tin oxide (ITO) and indium zinc oxide (IZO).

As illustrated in FIG. 4, the edge cover 22 is provided in a lattice pattern on the TFT layer 20a in such a manner as to cover a peripheral portion of each first electrode 21. The edge cover 22 is provided between each of the light-emitting regions Lr, Lg and Lb, and functions as a partition for partitioning each of the light-emitting regions Lr, Lg, and Lb.

For materials constituting the edge cover 22 include organic resin materials of, for example, a polyimide resin and a spin-on glass (SOG) resin.

As illustrated in FIG. 4, the plurality of organic EL layers 23 are disposed on each of the first electrodes 21 and are each provided in a matrix shape so as to correspond to the plurality of subpixels. As illustrated in FIG. 5, each organic EL layer 23 includes a hole injection layer 1, a hole transport layer 2, a light-emitting layer 3, an electron transport layer 4, and an electron injection layer 5, which are provided sequentially in that order over the first electrode 21.

The hole injection layer 1 is also referred to as an anode electrode buffer layer, and functions to reduce an energy level difference between the first electrode 21 and the organic EL layer 23 to thereby improve the efficiency of hole injection into the organic EL layer 23 from the first electrode 21. For materials constituting the hole injection layer 1 include, for example, a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 2 functions to improve the efficiency of hole transport from the first electrode 21 to the organic EL layer 23. For materials constituting the hole transport layer 2 include, for example, a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light-emitting layer 3 is a region where holes and electrons are injected from the first electrode 21 and the second electrode 24, respectively, and the holes and the electrons recombine, when a voltage is applied via the first electrode 21 and the second electrode 24. The light-emitting layer 3 is formed of a material having a high light emitting efficiency. Then, for materials constituting the light-emitting layer 3 include, for example, a metal oxinoid compound [8-hydroxyquinoline metal complex), a naphthalene derivative, an anthracene derivative, a diphenyl ethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styrylamine derivative, a bisstyrylbenzene derivative, a trisstyrylbenzene derivative, a perylene derivative, a perinone derivative, an aminopyrene derivative, a pyridine derivative, a rhodamine derivative, an aquridine derivative, phenoxazone, a quinacridone derivative, rubrene, poly-p-phenylenevinylene, and polysilane.

The electron transport layer 4 functions to facilitate migration of electrons to the light-emitting layer 3 efficiently. For materials constituting the electron transport layer 4 include, for example, an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound, as organic compounds.

The electron injection layer 5 functions to reduce an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 30 by this function. Note that the electron injection layer 5 is also referred to as a cathode electrode buffer layer. For materials constituting the electron injection layer 5 include, for example, inorganic alkaline compounds such as lithium fluoride (LiF), magnesium fluoride (MgF$_2$), calcium fluoride (CaF$_2$), strontium fluoride (SrF$_2$) and barium fluoride (BaF$_2$), aluminum oxide (Al$_2$O$_3$), and strontium oxide (SrO).

As illustrated in FIG. 4, the second electrode 24 is provided to cover each organic EL layer 23 and edge cover 22. The second electrode 24 functions to inject electrons into the organic EL layer 23. The second electrode 24 is preferably formed of a material having a small work function to improve the efficiency of electron injection into the organic EL layer 23. For materials constituting the second electrode 24 include, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may be formed of alloys of magnesium (Mg)/copper (Cu), magnesium (Mg)/silver (Ag), sodium (Na)/potassium (K), astatine (At)/astatine oxide (AtO$_2$), lithium (Li)/aluminum (Al), lithium (Li)/calcium (Ca)/aluminum (Al), and lithium fluoride (LiF)/calcium (Ca)/aluminum (Al), for example. The second electrode 24 may be formed of an electrically conductive oxide such as tin oxide (SnO), zinc oxide (ZnO), indium tin oxide (ITO), and indium zinc oxide (IZO). The second electrode 24 may be formed by layering a plurality of layers of any of the materials described above. For materials having a small work function include, for example, magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 4, the organic EL display device 50a includes a sealing film 28, which covers the organic EL element 30. The sealing film 28 includes a first inorganic film 25 provided in such a manner as to cover the second electrode 24, an organic film 26 provided in such a manner as to cover the first inorganic film 25, and a second inorganic film 27 provided in such a manner as to cover the organic film 26, and functions to protect the organic EL layer 23 from moisture, oxygen, and the like.

The first inorganic film 25 and the second inorganic film 27 are constituted of an inorganic material such as silicon oxide ($SiO_2$), aluminum oxide ($Al_2O_3$), silicon nitride (SiNx (x is a positive number)) like trisilicon tetranitride ($Si_3N_4$), or silicon carbonitride (SiCN). The organic film 26 is constituted of an organic material such as, for example, acrylate, polyurea, parylene, polyimide, or polyamide.

In the organic EL display device 50a described heretofore, in each subpixel P, a gate signal is inputted into the first TFT 9a via the gate line 14 to thereby turn on the first TFT 9a, a predetermined voltage corresponding to a source signal is written in the gate electrode 14b of the second TFT 9b and the capacitor 9c via the source line 18f, the magnitude of current from the power source line 18g is specified based on a gate voltage of the second TFT 9b, and the specified current is supplied to the organic EL layer 23, whereby the light-emitting layer 3 of the organic EL layer 23 emits light to display an image.

In the organic EL display device 50a, since even when the first TFT 9a is turned off, the gate voltage of the second TFT 9b is held by the capacitor 9c, the light-emitting layer 3 is kept emitting light until a gate signal of the next frame is inputted.

The organic EL display device 50a of the present embodiment can be fabricated, for example, by forming the TFT layer 20a and the organic EL element 30 on the surface of the resin substrate layer 10 formed on the glass substrate by use of a known method, and then separating the glass substrate from the resin substrate layer 10.

Figure 6:
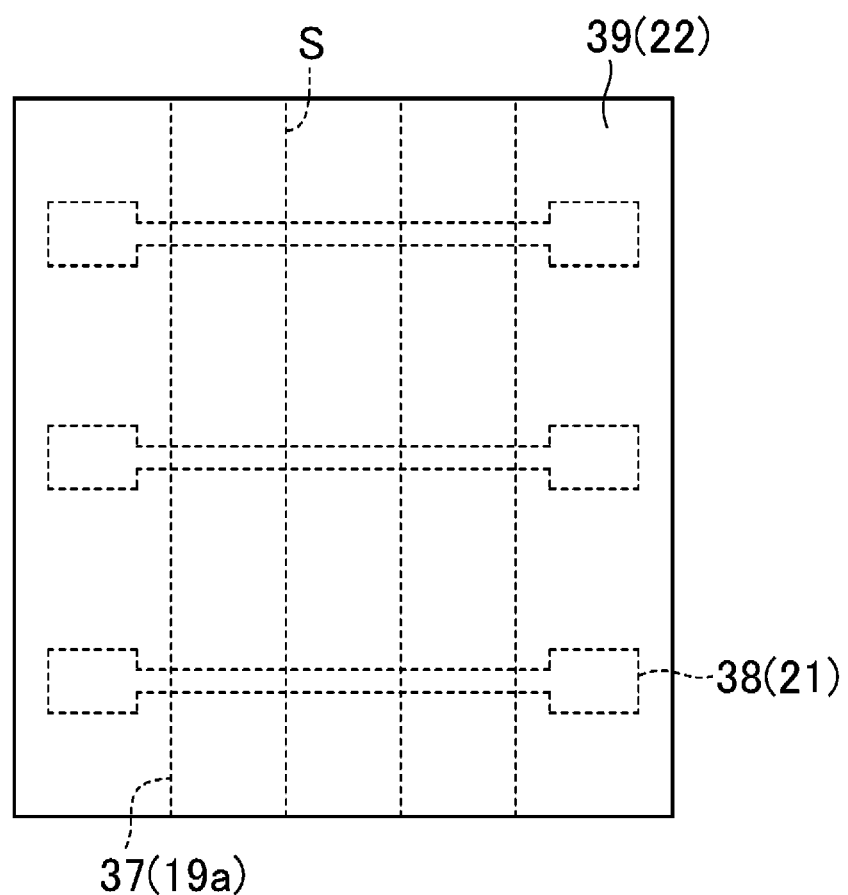
FIG. 6 is a plan view of a bending portion of the organic EL display device according to the first embodiment.

The following will describe the bending portion of the present embodiment. FIG. 6 is a plan view of the bending portion G of the organic EL display device 50a according to the present embodiment, and FIG. 7 is a cross-sectional view of the bending portion G of the organic EL display device 50a according to the present embodiment.

Figure 7:
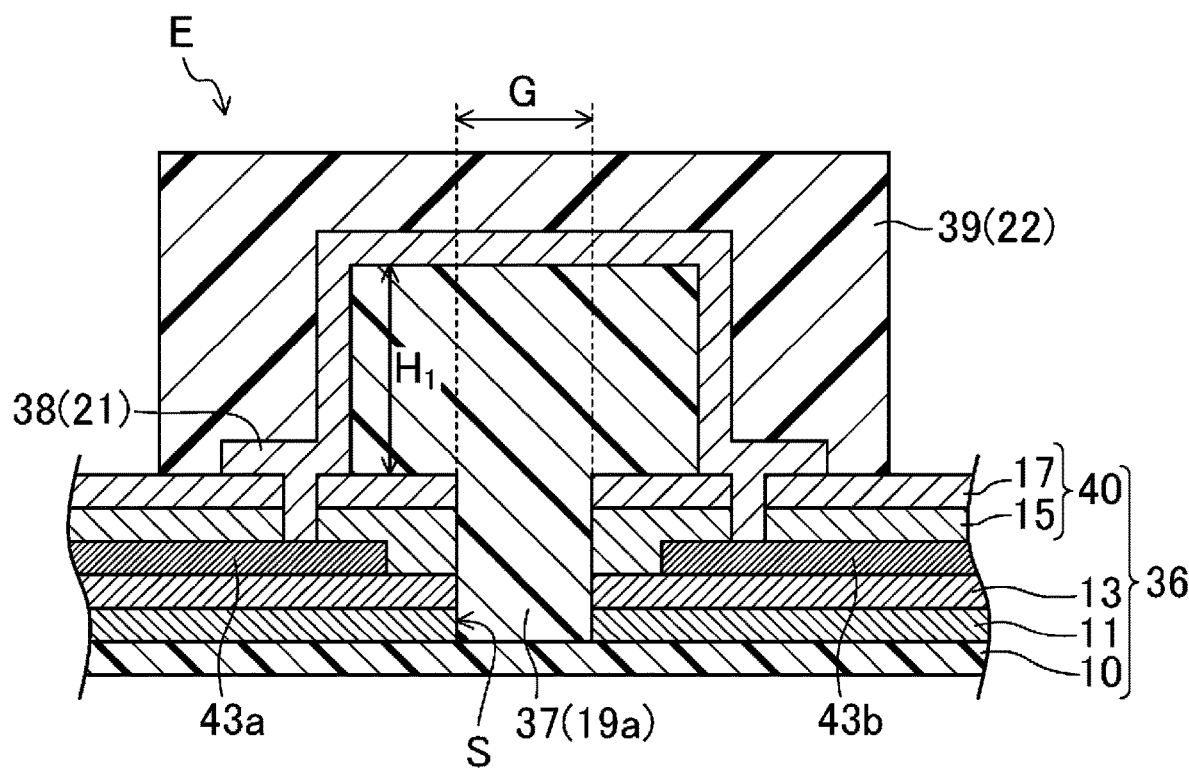
FIG. 7 is a cross-sectional view of a bending portion of the organic EL display device according to the first embodiment.

As illustrated in FIGS. 6 and 7, the organic EL display device 50a includes, in a bending region E, the resin substrate layer 10, an inorganic layered film 36 and a frame flattening film 37 provided on the surface of the resin substrate layer 10, a plurality of frame wiring lines 38 provided on the surface of the frame flattening film 37 to connect gate conductive layers 43a and 43b, and a surface protection layer 39 provided in such a manner as to cover the frame wiring lines 38.

The gate conductive layer 43a is electrically connected to signal wiring lines (the gate line 14, source line 18f, power source line 18g, and the like) provided in the TFT layer 20a in the display region D, and is provided to extend toward the display region D side. The gate conductive layer 43b is provided to extend to the terminal portion T.

The plurality of frame wiring lines 38 are electrically connected to the signal wiring lines in the display region D and are provided on the frame flattening film 37 across an opening S, and the surface protection layer 39 is configured to cover the frame wiring lines 38, as illustrated in FIGS. 6 and 7. Accordingly, the frame wiring lines 38 are protected by the surface protection layer 39.

The surface protection layer 39 is formed of the same material as that of the edge cover 22 described above; the surface protection layer 39 is formed in the same layer as that of the edge cover 22.

In addition, as illustrated in FIG. 1, the opening S is open from one end portion to the other end portion of the frame region F along the bending portion G, and as illustrated in FIGS. 1 and 7, the frame flattening film 37 is provided in a belt shape to cover the opening S and an end portion on the opening S side of the inorganic layered film 36.

A height $H_1$ of the frame flattening film 37 is formed to be lower than a height $H_3$ of the flattening film illustrated in FIG. 4.

As illustrated in FIGS. 1 and 7, the surface protection layer 39 is provided in a belt shape interposing therein the frame wiring line 38 in such a manner as to cover an end portion of the belt-shaped frame flattening film 37.

The inorganic layered film 36 is at least a one-layer inorganic layer constituting the TFT layer 20a, and includes, as illustrated in FIG. 7, the base coat film 11, the gate insulating film 13, and an interlayer insulating film 40 formed of the first interlayer insulating film 15 and the second interlayer insulating film 17, which are sequentially layered on the resin substrate layer 10. Note that the inorganic layered film 36 is also provided in the frame region F.

The gate conductive layers 43a and 43b are provided between the gate insulating film 13 and the interlayer insulating film 40 constituting the inorganic layered film 36.

As illustrated in FIG. 7, in the bending portion G, the base coat film 11, the gate insulating film 13, and the interlayer insulating film 40 of the inorganic layered film 36 are not provided, while the opening S is formed in the inorganic layered film 36 and the frame flattening film 37 is configured to cover the opening S.

Furthermore, the bending portion G provided with the frame flattening film 37, the frame wiring line 38, and the surface protection layer 39 is configured to be bendable at an angle of up to 180 degrees.

In the present embodiment, as illustrated in FIG. 7, the frame wiring line 38 is formed of the same material as that of the first electrode 21, and the frame flattening film 37 is formed of the same material as that of the flattening film 19a.

In other words, in the present embodiment, the frame wiring line 38 is formed in the same layer as the first electrode 21, and the frame flattening film 37 is formed in the same layer as the flattening film 19a.

Accordingly, in the present embodiment, since the frame wiring line 38 is formed of the same metal material as that of the first electrode provided on the flattening film 19a in the display region D, it is possible to form the frame flattening film 37 provided under the frame wiring 38 by the same inexpensive resin material as that of the flattening film 19a in the bending portion G similarly to the configuration of the display region D illustrated in FIG. 4.

As a result, since the frame flattening film 37 can be formed of an organic resin material such as an inexpensive acrylic resin in comparison with an organic resin material such as a polyimide resin for forming a frame flattening film in the conventional art, it is possible to significantly reduce the cost of the organic EL display device 50a.

As discussed above, the organic EL display device 50a of the present embodiment is able to exhibit the following effects.

(1) The frame wiring line 38 is formed of the same metal material as that of the first electrode 21, and the frame flattening film 37 is formed of the same resin material as that of the flattening film 19a. Accordingly, a conventional process of forming a frame flattening film to cover the opening S formed in the bending portion G is unnecessary, thereby making it is possible to significantly reduce the cost of the organic EL display device 50a.

(2) In the bending portion G, the inorganic layered film 36 (the base coat film 11, gate insulating film 13, and interlayer insulating film 40) is removed to form the opening S. Accordingly, it is possible to prevent the generation of cracks caused by the inorganic layered film 36 in the bending portion G.

Second Embodiment

Figure 8:
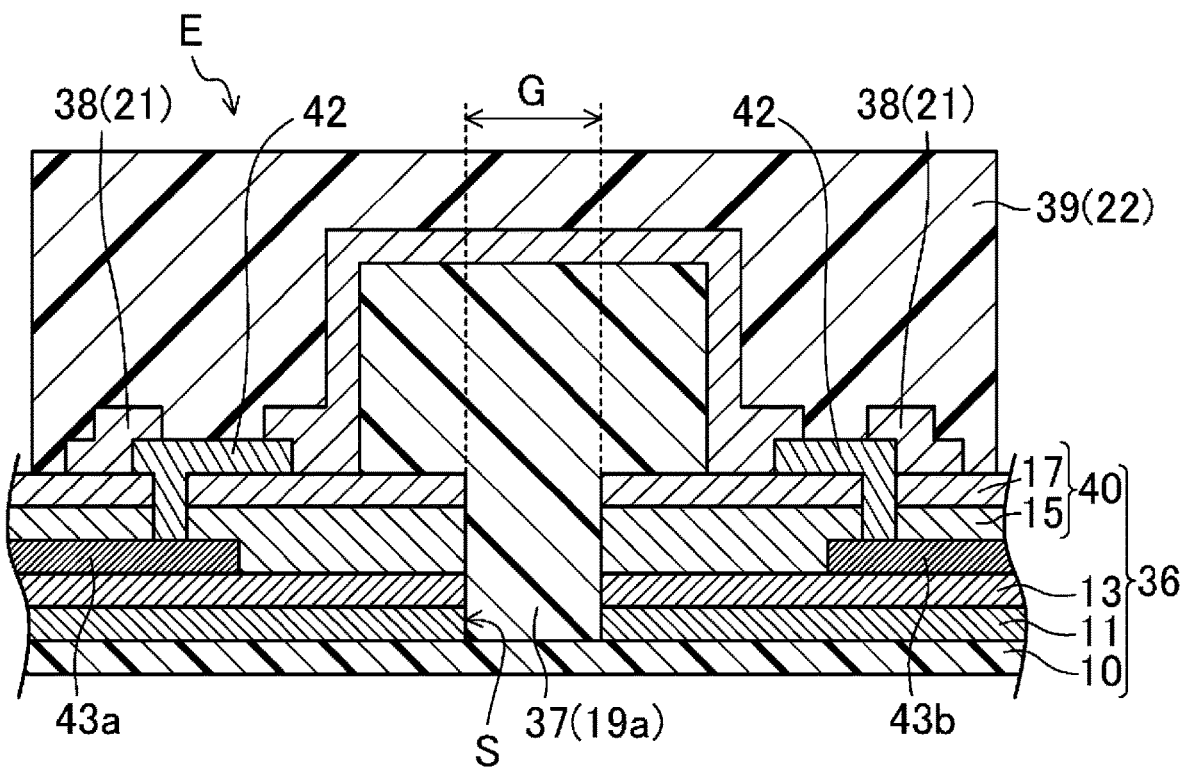
FIG. 8 is a cross-sectional view of a bending portion of an organic EL display device according to a second embodiment.

A second embodiment of the present invention will be described below. FIG. 8 is a cross-sectional view of a bending portion of an organic EL display device according to the present embodiment. Note that the entire configuration of the organic EL display device is the same as that of the first embodiment described above, and detailed description thereof will be omitted. Note that elements common to those in the first embodiment are denoted by the same reference signs, and duplicated description thereof will be omitted.

As illustrated in FIG. 8, in the present embodiment, a source conductive layer 42 is provided. on the lower layer side of the frame flattening film 37. The source conductive layer 42 is electrically connected to signal wiring lines (the gate line 14, source line 18f, power source line 18g, and the like) provided in the TFT layer 20a in the display region D.

The source conductive layer 42 is electrically connected to the frame wiring line 38 within the surface protection layer 39. As illustrated in FIG. 8, the entire surface or at least an end portion of the source conductive layer 42 is covered by the frame wiring line 38.

The source conductive layer 42 is electrically connected to the gate conductive layers 43a, 43b within the surface protection layer 39.

The organic EL display device 50a of the present embodiment described above is able to exhibit the following effects in addition to the above-discussed effects (1) and (2).

(3) Within the surface protection layer 39, the frame wiring line 38 is electrically connected to the source conductive layer 42. Accordingly, the frame wiring line 38 can be connected to the wiring line with low resistance.

(4) Since the entire surface or at least the end portion of the source conductive layer 42 is covered by the frame wiring line 38, it is possible to prevent the end portion of the source conductive layer 42 from being etched when etching the frame wiring line 38.

(5) Within the surface protection layer 39, the source conductive layer 42 is connected to the gate conductive layer 43a provided in such a manner as to extend toward the display region D side. Accordingly, it is possible to distribute the wiring line to the display region D side by using the gate conductive layer 43a provided between the gate insulating film 13 and the interlayer insulating film 40 constituting the inorganic layered film 36, thereby making it possible to prevent the penetration of moisture.

Other Embodiments

Figure 9:
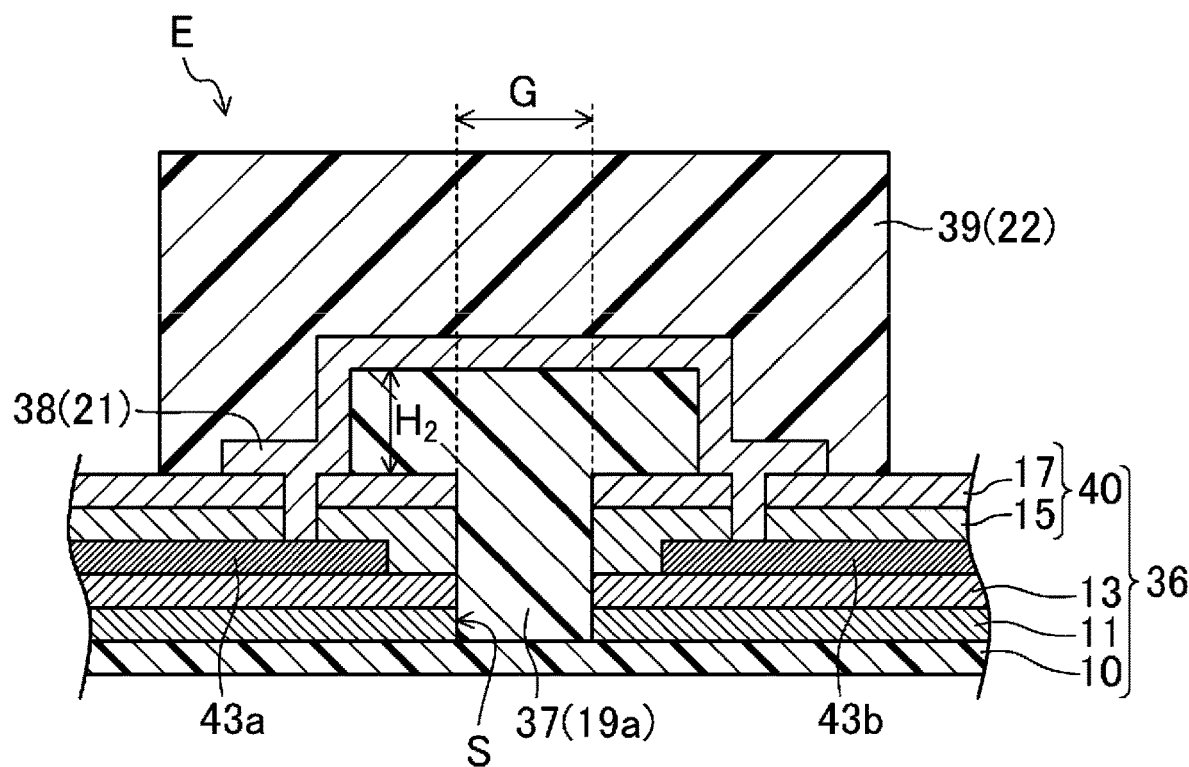
FIG. 9 is a cross-sectional view of a bending portion of an organic EL display device according to a modification example.

When forming the frame flattening film 37 described above, the amount of exposure radiated onto a resin material to form the frame flattening film 37 may be controlled by performing exposure treatment (halftone exposure treatment) using a halftone mask as a photomask, and as illustrated in FIG. 9, a height H2 of the frame flattening film 37 may be formed to be lower than the height $H_1$ of the frame flattening film 37 illustrated in FIG. 7 in the aforementioned embodiment. At an end portion of the frame flattening film 37, resist is likely to remain when patterning the first electrode 21, and leaks occur between the lines in some cases. However, the leaks may be prevented by the above-discussed configuration.

Figure 10:
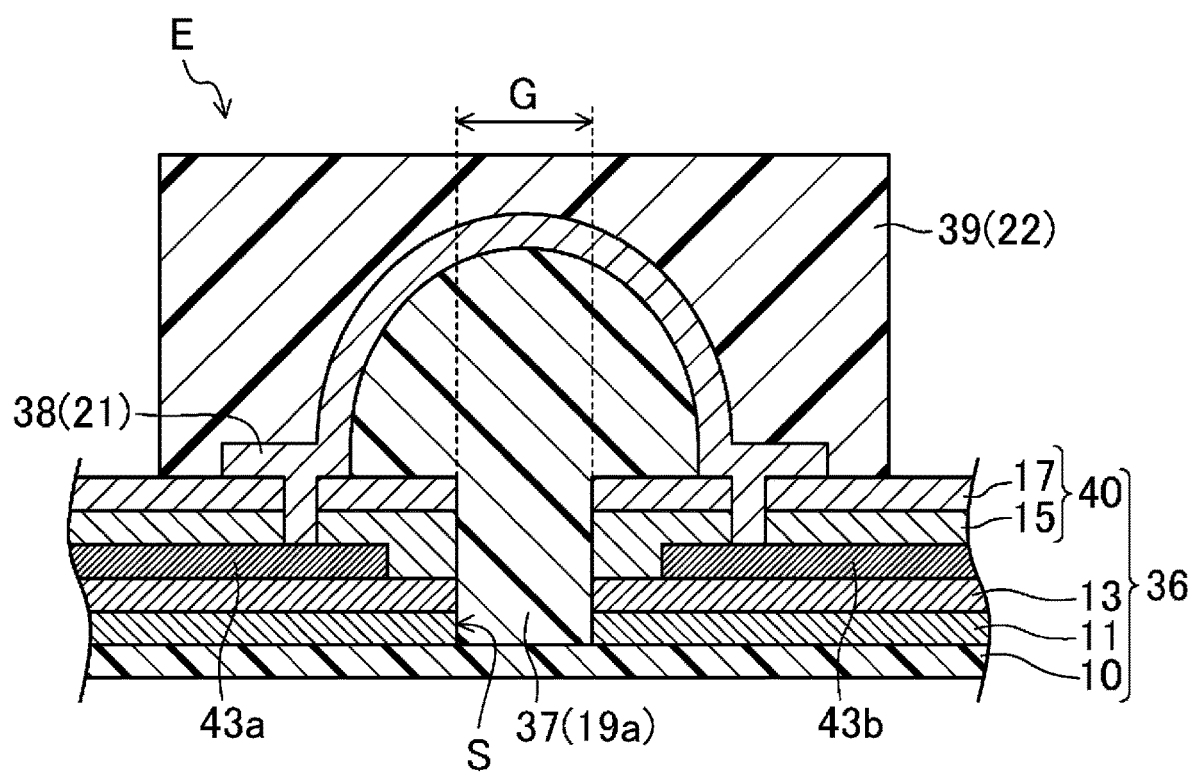
FIG. 10 is a cross-sectional view of a bending portion of an organic EL display device according to a modification example.

Furthermore, by performing the above-mentioned halftone exposure treatment, a frame flattening film 37 may be formed to have a gentle cross-sectional shape (an approximately circular shape or approximately elliptical shape), as illustrated in FIG. 10.

Figure 11:
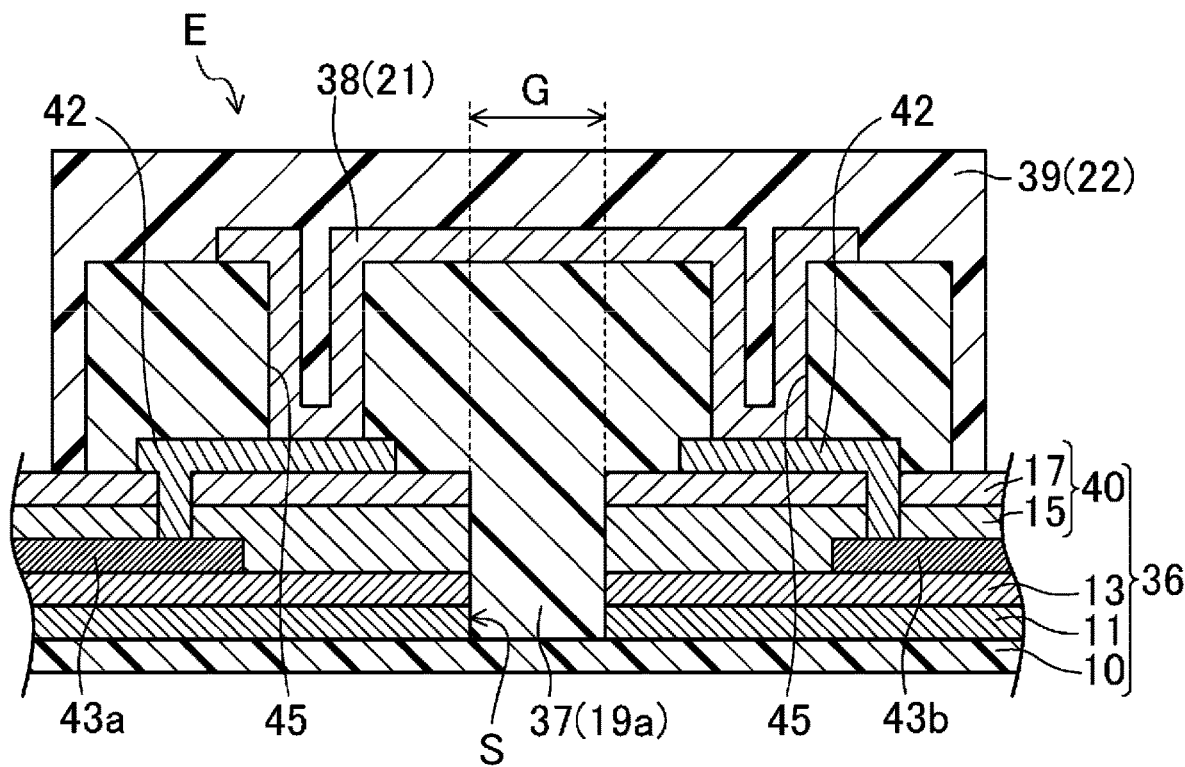
FIG. 11 is a cross-sectional view of a bending portion of an organic EL display device according to a modification example.

Moreover, as illustrated in FIG. 11, a contact hole 45 may be formed in the frame flattening film 37, and the frame wiring line 38 and the source conductive layer 42 may be configured to be electrically connected via the contact hole 45. Such a configuration may prevent the source conductive layer 42 from being etched when etching the frame wiring line 38.

In the above embodiments, the frame wiring line 38 is formed of the same material as that of the first electrode 21, but the frame wiring line 38 may be formed of another metal. For example, the frame wiring line may be formed of the same material as that of the second electrode 24.

In the organic EL display device 50a of the embodiments described above, the example of the organic EL layer is given that has the five-layer structure including the hole injection layer, the hole transport layer, the light-emitting layer, the electron transport layer, and the electron injection layer. However, the organic EL layer may have, for example, a three-layer structure including a hole injection-cum-transport layer, a light-emitting layer, and an electron transport-cum-injection layer.

In the above-described embodiments, the example of the organic EL display device including the first electrode as an anode electrode and the second electrode as a cathode electrode is given. However, the present invention is also applicable to an organic EL display device in which the layers of the structure of the organic EL layer are in the reverse order, where the first electrode is a cathode electrode and the second electrode is an anode electrode.

In the above-described embodiments, the example of the organic EL display devices in which the electrode of the TFT connected to the first electrode serves as the source electrode is given. However, the present invention is also applicable to an organic EL display device in which the electrode of the TFT connected to the first electrode is referred to as the drain electrode.

In the above embodiments, although the organic EL display device is described as an example of the display device, the present invention may be applied to a display device including a plurality of current-driven light-emitting elements, for example, a display device including a quantum dot light-emitting diode (QLED), which is a light-emitting element using a quantum dot-containing layer.

INDUSTRIAL APPLICABILITY

As described thus far, the present invention is useful for display devices such as an organic EL display device.

The invention claimed is:

1. A display device comprising:
a resin substrate;
a TFT layer provided on the resin substrate and including a flattening film;
a light-emitting element provided on the resin substrate with the TFT layer interposed between the light-emitting element and the resin substrate to constitute a display region;
a frame region provided on a periphery of the display region;
a terminal portion provided at an end portion of the frame region;
a bending portion provided between the display region and the terminal portion;
a plurality of frame wiring lines provided in the frame region, connected to wiring lines in the display region, and extended to the terminal portion; and
at least a one-layer inorganic film provided in the frame region to constitute the TFT layer layered on the resin substrate,
wherein the light-emitting element includes a metal electrode provided on the flattening film,
in the bending portion, an opening is formed in at least the one-layer inorganic film, a frame flattening film is provided to fill the opening, and the plurality of frame wiring lines are provided on the frame flattening film across the opening, and
the frame wiring line is a frame wiring line of the plurality of frame wiring lines formed of a metal material identical to the metal material of the metal electrode, and the frame flattening film is formed of a resin material identical to the resin material of the flattening film,
wherein a surface protection layer is formed on the frame wiring line,
the opening is open from one end portion to the other end portion of the frame region along the bending portion,
the frame flattening film is provided in a belt shape to cover the opening and an end portion on the opening side of at least the one-layer inorganic film, and
the surface protection layer is provided in a belt shape interposing the frame wiring line within the surface protection layer in such a manner as to cover an end portion of the belt-shaped frame flattening film,
wherein the TFT layer includes a metal layer,
a first conductive layer formed of a material identical to the material of the metal layer is provided on a lower layer side of the frame flattening film, and
the frame wiring line is electrically connected to the first conductive layer within the surface protection layer.

2. The display device according to claim 1,
wherein the frame wiring line and the metal electrode are formed in an identical layer, and the frame flattening film and the flattening film are formed in an identical layer.

3. The display device according to claim 2,
wherein a height of the frame flattening film is lower than a height of the flattening film.

4. The display device according to claim 1,
wherein an edge cover is provided on the flattening film, and
the surface protection layer and the edge cover are formed in the identical layer.

5. The display device according to claim 1,
wherein an entire surface or at least an end portion of the first conductive layer is covered by the frame wiring line.

6. The display device according to claim 1,
wherein a contact hole is formed in the frame flattening film, and
the frame wiring line is electrically connected to the first conductive layer via the contact hole.

7. The display device according to claim 1,
wherein a second conductive layer is provided between the plurality of inorganic films,
the first conductive layer is electrically connected to the second conductive layer within the surface protection layer, and
the second conductive layer is provided extending toward the display region side.

8. The display device according to claim 1,
wherein the light-emitting element includes a first electrode, a second electrode provided opposing the first electrode, and a light-emitting layer provided between the first electrode and the second electrode, and
the first electrode is the above-mentioned metal electrode.

9. The display device according to claim 8,
wherein the first electrode is a reflective electrode configured to reflect light emitted from the light-emitting layer.

10. The display device according to claim 1,
wherein the resin material is an acrylic resin, an epoxy resin, or a polyimide resin.

11. The display device according to claim 1,
wherein the light-emitting element is an organic EL element.

* * * * *